(12) United States Patent
Murayama et al.

(10) Patent No.: US 6,266,389 B1
(45) Date of Patent: Jul. 24, 2001

(54) METHOD FOR MANUFACTURING A DEVICE, AN EXPOSURE APPARATUS, AND A METHOD FOR MANUFACTURING AN EXPOSURE APPARATUS

(75) Inventors: Norio Murayama, Musashino; Hideki Komatsuda, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/395,471

(22) Filed: Sep. 14, 1999

(30) Foreign Application Priority Data

Sep. 14, 1998 (JP) .................................................. 10-260170

(51) Int. Cl.[7] .................................................. G21K 5/00
(52) U.S. Cl. .................................................. 378/34
(58) Field of Search .................................................. 378/34

(56) References Cited

U.S. PATENT DOCUMENTS

| 5,076,695 | 12/1991 | Ichihara . | |
|---|---|---|---|
| 5,392,119 | 2/1995 | McArthur et al. . | |
| 5,420,436 | 5/1995 | Seya et al. . | |
| 5,549,994 | * 8/1996 | Watanabe et al. | 378/34 |
| 5,640,233 | 6/1997 | McArthur et al. . | |
| 5,825,844 | * 10/1998 | Miyake et al. | 378/34 |
| 5,917,879 | 6/1999 | Mashima . | |
| 5,929,991 | 7/1999 | McArthur et al. . | |

FOREIGN PATENT DOCUMENTS

| 57-64139 | 4/1982 | (JP) . |
|---|---|---|
| 07084098 | 3/1995 | (JP) . |
| 08203805 | 8/1996 | (JP) . |
| 10030170 | 2/1998 | (JP) . |

\* cited by examiner

Primary Examiner—Craig E. Church
(74) Attorney, Agent, or Firm—Chapman and Cutler

(57) ABSTRACT

An exposure apparatus comprises an X-ray source (2–3, 100, 101), an illumination system (4–7) for guiding said X-ray from an X-ray source to a mask (8), a projection system (9) for projecting a pattern on said mask by guiding said X-ray to an exposed plane (10) through a mask, wherein a projection system comprises a plurality of mirrors (91–94), and at least one reflection mirror (91) is interchangeable with a reflection mirror (97) having a different surface shape.

20 Claims, 8 Drawing Sheets

METHOD FOR MANUFACTURING A DEVICE, AN EXPOSURE APPARATUS, AND A METHOD FOR MANUFACTURING AN EXPOSURE APPARATUS

BACKGROUND OF THE INVENTION

1. Field of the Invention

The present invention relates to an exposure apparatus for manufacturing devices such as semiconductor devices, liquid crystal display devices, or thin-film magnetic head by means of the lithography process. Also, the present invention relates to a method for manufacturing an exposure apparatus, and a method for manufacturing a device using an exposure apparatus.

2. Description of the Related Art

A conventional exposure apparatus is generally used for manufacturing semiconductor devices, liquid crystal display devices, or thin-film magnetic heads. This is a projection exposure apparatus which projects a predetermined pattern formed on a mask as a projection master onto a photosensitive substrate through a projection optical system. There are three types of conventional projection optical systems. A refraction type projection optical system comprises a refraction optical element having the optical property of transmitting an exposure light such as a lens. A reflection type projection optical system comprises a reflection optical element having an optical property of reflecting an exposure light such as a mirror. A conventional reflection and refraction type projection optical system comprises both reflection and refraction optical elements.

In order to manufacture highly integrated semiconductor devices the wave length of the exposure light has been shifted from the g-line toward the i-line, until the KrF excimer laser light had a wave length of 248 nm. Recently, an exposure light having a wave length of 193 nm can be produced by an ArF excimer laser. In the future, the more highly integrated semiconductor devices will be developed, the higher the resolution of a projection optical system in an exposure apparatus is required. A resolution of a projection optical system is represented by the formula below:

$$(\text{resolution}) = k * \lambda / NA,$$

where k denotes the k factor which is a positive constant, k<1, which varies with the properties of the resist, $\lambda$ denotes the wave length of an exposure light, NA denotes a numerical aperture of a projection optical system.

As it is obvious from the above mentioned formula, reducing the wavelength $\lambda$ is a very efficient technique for increasing the resolution of a projection optical system. As a result, an exposure apparatus using a soft X-ray having a wave length of 5–15 nm (Extreme Ultra Violet radiation, or EUV radiation) as an exposure light has been developed recently. This exposure apparatus using EUV radiation is very prominent at the moment as a potential example of the technology of an exposure apparatus of the future.

The U.S. Pat. No. 5,917,879 discloses a projection optical system for an exposure apparatus using an EUV radiation.

In a projection optical system of an exposure apparatus using EUV radiation, a refraction optical device such as a lens cannot be used because no hyaline material can transmit EUV radiation. Moreover, the number of reflection optical elements must be minimized because reflection optical elements such as mirrors are extremely inefficient in their reflectivity, reflecting only about 65% of light. For example, a projection optical system disclosed in the U.S. Pat. No. 5,917,879 has four mirrors.

In the case of actual manufacture of a projection system, there are manufacturing errors of each optical member constituting a projection optical system (a refraction optical element, a reflection optical element), and structural errors. Therefore the required image resolution properties according to design rules of the future generations cannot be achieved without adjustments. The manufacturing errors of each optical member must be reduced to a negligible value to satisfy the required image properties.

When the size of an optical member is small, it is difficult to adjust the position of each optical member of a projection system after assembly in accordance with the measured image property. This is because the degree of freedom for adjustment is small.

SUMMARY OF THE INVENTION

It is therefore an object of the present invention to provide a method for manufacturing an exposure apparatus, an exposure apparatus itself, and a method for manufacturing a device using the exposure apparatus which overcomes the above issues in the related art. This object is achieved by combinations described in the independent claims. The dependent claims define further advantageous and exemplary combinations of the present invention.

According to the first aspect of the present invention, a method for manufacturing an exposure apparatus which transcribes an image of a projection master on a substrate by a projection system having a plurality of reflection mirrors is provided. This manufacturing method comprises a first step for measuring an image property of a projection system having a plurality of reflection mirrors, a second step for selecting an image property component to be adjusted from an image property, a third step for selecting at least one of reflection mirrors which can adjust an image property component selected in a second step, a fourth step for calculating a surface shape which adjusts substantially an image property component based on an image property measured in a first step, a fifth step for giving a surface shape calculated in a fourth step to a reflection mirror, a sixth step for embedding a reflection mirror having a surface shape given in a fifth step into a projection system.

An image property component may include an image magnification error, a skew of an image, a curvature of an image plane, a gradient of an image plane, a displacement of a focal point caused by a direction in an aperture, a displacement of a focal point caused by a numerical aperture, and a telecentric error.

A method for manufacturing an exposure apparatus may further comprise a seventh step for selecting positions of reflection mirrors in a projection system, and positions of reflection mirrors may be selected so that an image property is adjusted substantially.

An image property may be measured using a light having a wave length used in a projection system in a first step.

An image property may be measured by using a light having a wave length other than used in a projection system in the first step.

A surface shape may be given to a reflection mirror having essentially the same shape as selected reflection mirror in a fifth step, and a reflection mirror in a projection system may be interchanged with a reflection mirror given a surface shape in a sixth step. A reflection mirror placed near a projection master or a substrate may be selected in the third step.

A reflection mirror placed near an aperture stop of a projection system is selected in said third step.

According to the second aspect of the present invention, an exposure apparatus is provided. This exposure apparatus comprises an X-ray source, an illumination system for guiding an X-ray from an X-ray source to a mask, a projection system for projecting a pattern on a mask by guiding an X-ray to an exposed plane through a mask, where a projection system is manufactured by a method according to one of the above mentioned methods.

According to the third aspect of the present invention, an exposure apparatus is provided. This exposure apparatus comprises an X-ray source, an illumination system for guiding an X-ray from an X-ray source to a mask, a projection system for guiding an X-ray to an exposed plane through a mask and projecting a pattern on a mask, where a projection system comprises a plurality of reflection mirrors, and at least one reflection mirror among the reflection mirrors is interchangeable with a reflection mirror having a surface shape different from that of the one reflection mirror.

A certain aberration component among a plurality of aberration components in a projection system may be changed by interchanging a reflection mirror without substantially influencing other aberration components.

The reflection mirror which is interchangeable may be a reflection mirror placed near a projection master or a substrate.

The reflection mirror which is interchangeable may not have a substantial power.

The reflection mirror which is interchangeable may be a reflection mirror placed near a aperture stop of a projection system.

An aperture stop may be placed on at least one reflection mirror among reflection mirrors constituting a projection system.

According to the fourth aspect of the present invention, a method for manufacturing a device using the above exposure apparatus is provided. This manufacturing method comprises printing a photosensitive material on a substrate, projecting an image of a pattern on a mask onto a substrate through the projection system as described above, developing a photosensitive material on a substrate, forming a predetermined circuit pattern onto a substrate by using a developed photosensitive material as a mask.

This summary of the invention does not necessarily describe all necessary features so that the invention may also be a sub-combination of these described features.

DETAILED DESCRIPTION OF THE INVENTION

The present invention will now be described based on the preferred embodiments. This does not intend to limit the scope of the present invention, but exemplify the invention. All of the features and the combinations thereof described in the embodiments are not necessarily essential to the invention.

In the description below, an X-ray refers to an electromagnetic wave having a wave length of about 1–50 nm.

The first embodiment of the present invention will be described below with reference to the accompanying drawings.

Figure 1:
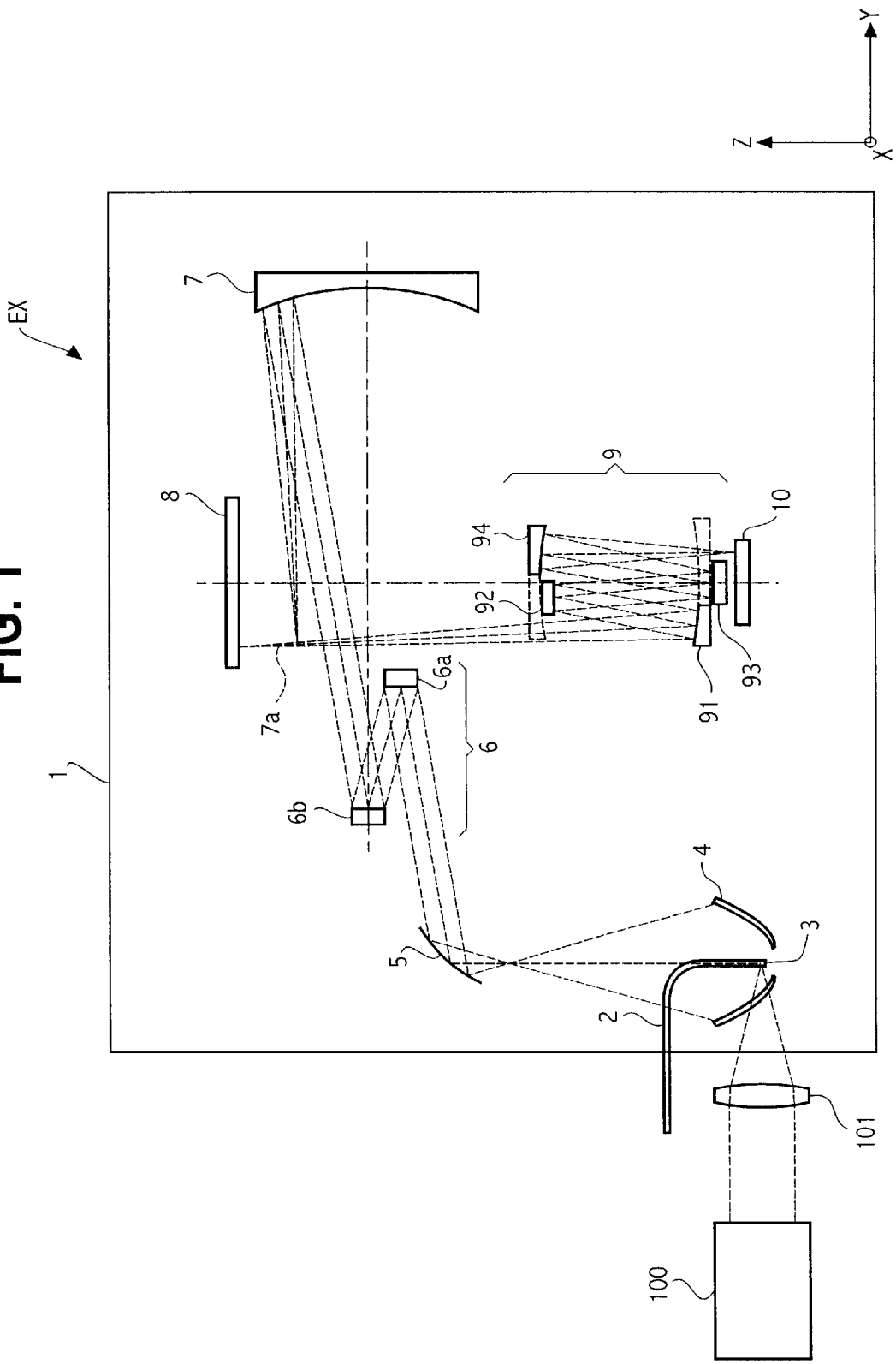
FIG. 1 schematically shows an exposure apparatus according to the first embodiment of the present invention.

FIG. 1 shows the exposure apparatus EX of the first embodiment of the present invention. The exposure apparatus EX is a step and scan type projection exposure apparatus using an EUV radiation having a wave length about 5–15 nm as an exposure light. In FIG. 1 the Z-axis is parallel to the optical axis of the projection system 9 which projects a reduction image of a mask 8 onto a wafer 10. The Y-axis is perpendicular to the Z-axis in the paper plane, and the X-axis is perpendicular to the paper plane.

The exposure apparatus EX scans the reflection type reticle 8 and the wafer 10 against the projection system 9 along the one-dimensional direction (Y direction in this embodiment), as the partial image of the circuit pattern formed on a reflection type reticle 8 as a mask is projected through the projection system 9 onto a wafer 10 as a substrate. It then transcribes the entire circuit pattern formed on the reflection type reticle 8 as a mask onto each of a plurality of shooting areas of a wafer 10 by means of the step and scan method.

The soft X-rays which used as an exposure light in this embodiment are very poorly transmitted through the air. The optical path of the EUV radiation is therefore encased in the vacuum chamber 1.

The illumination system of this embodiment is described below.

The laser light source 100 supplies a laser light having a wave length range from infra-red to visible light. For example, the YAG laser using the excitation by the semiconductor laser, or the excimer laser can be used as the laser light source 100. The laser light is condensed at the position 3 by the condensing optical system 101. The nozzle 2 expels gaseous material to the position 3 where the gaseous material contacts with the highly condensed laser light. The gaseous material then becomes hot due to the energy of the laser light and excited to a plasma. EUV radiation is radiated during the transition from plasma to the lower potential level.

Around the position 3 an elliptic mirror 4 constituting a condensing optical system is positioned. The elliptic mirror 4 is placed at the position where its first focal point nearly coincides with the position 3. The inner surface of the elliptic mirror 4 is coated with a multi-layer membrane for reflecting the EUV radiation. The EUV radiation reflected by the inner surface of the elliptic mirror 4 is condensed at the second focal point of the elliptic mirror 4, and goes to the paraboloid mirror 5 constituting another condensing optical system. The focal point of the paraboloid mirror 5 is in nearly coincides with the second focal position of the elliptic mirror 4. The inner surface of the paraboloid mirror 5 is also coated with a multi-layer membrane for reflecting the EUV radiation.

The EUV radiation reflected by the paraboloid mirror 5 is almost collimated and goes to the reflection fly-eye optical system 6 as an optical integrator. The reflection fly-eye optical system 6 comprises the first reflection element 6a having a plurality of reflection planes and the second reflection element 6b having a plurality of reflection planes corresponding to the reflection planes of the first reflection element 6a. The surfaces of the plurality of reflection planes of the first and second reflection elements 6a, 6b are also coated by multi-layer membrane for reflecting the EUV radiation.

The wavefront of the EUV radiation collimated by the paraboloid mirror 5 is split by the first reflection element 6a, and a plurality of light source images condensed by each reflection plane is formed. The second reflection element 6b is deposited at a position near the light source images. The reflection planes of the second reflection elements 6b act as a field of mirrors. The reflection fly-eye optical system 6 forms a plurality of light source images as the second light source on the basis of the nearly parallel luminous flux from the paraboloid mirror 5. The reflection fly-eye optical system was disclosed in a similar manner in the Japanese Laid-Open Publication 10-47400.

The EUV radiation from the second light source formed by the reflection fly-eye optical system 6 goes to the condenser mirror 7 whose focal point is near the position of the second light source. It is then reflected and condensed by the condenser mirror 7, finally arriving at the reflection type reticle 8 through the reflection mirror 7a. The surfaces of the condenser mirror 7 and the reflection mirror 7a are coated with a multi-layer membrane for reflecting the EUV radiation. The condenser mirror 7 uniformly illuminates the predetermined area of the reflection type reticle 8 by condensing and superimposing the EUV radiation from the second light source.

In this embodiment, the illumination system is a non-telecentric system and the projection system 9 is also a non-telecentric system on the reticle side. This splits spatially the optical path to the reflection type reticle 8 and the optical path from the reflection type reticle 8 to the projection system 9.

The multi-layer reflection membrane having a shape according to the predetermined pattern to be transferred onto the wafer 10 is deposited on the reflection type reticle 8. The EUV radiation is reflected by the reflection type reticle 8 and directed to the projection system 9, including the information of the pattern formed on the reflection type reticle 8.

The projection system 9 of this embodiment comprises four reflection mirrors. The first mirror 91 has a concave shape, the second mirror 92 has a convex shape, the third mirror 93 has a convex shape, and the fourth mirror 94 has a concave shape. The surface of each mirror 91–94 is coated with a multi-layer membrane for reflecting the EUV radiation. Each mirror is placed at the position where the optical axes of mirrors are coaxial.

The first mirror 91, the second mirror 92, and the fourth mirror 94 have a notch so as not to block the optical path formed by each mirror 91–94. The non-illustrated aperture stop is deposited at the third mirror 93.

The EUV radiation reflected by the reflection type reticle 8 is further reflected by each mirror 91–94 in order of precedence. This forms the reduction image of the pattern of the reflection type reticle 8 onto the projection area of the wafer 10 with the predetermined reduction magnification $\beta$ (for example, $|\beta|=¼, ⅕, ⅙$). The projection system 9 is telecentric on the side of the image (wafer 10).

The reflection type reticle 8 is held by the reticle stage which is movable along at least the direction Y and the wafer 10 is held by the wafer stage movable along the X-Y-Z direction, though these stages is not illustrated in FIG. 1. During the exposure process, as the illumination area of the reflection type reticle 8 is illuminated with the EUV radiation from the illumination system, the reflection type reticle 8 and the wafer 10 are shifted against the projection system 9 with the velocity ratio determined by the reduction magnification of the projection system 9. The pattern of the reflection type reticle 8 is exposed to the predetermined shooting area of the wafer 10 by scanning process.

Figure 2:
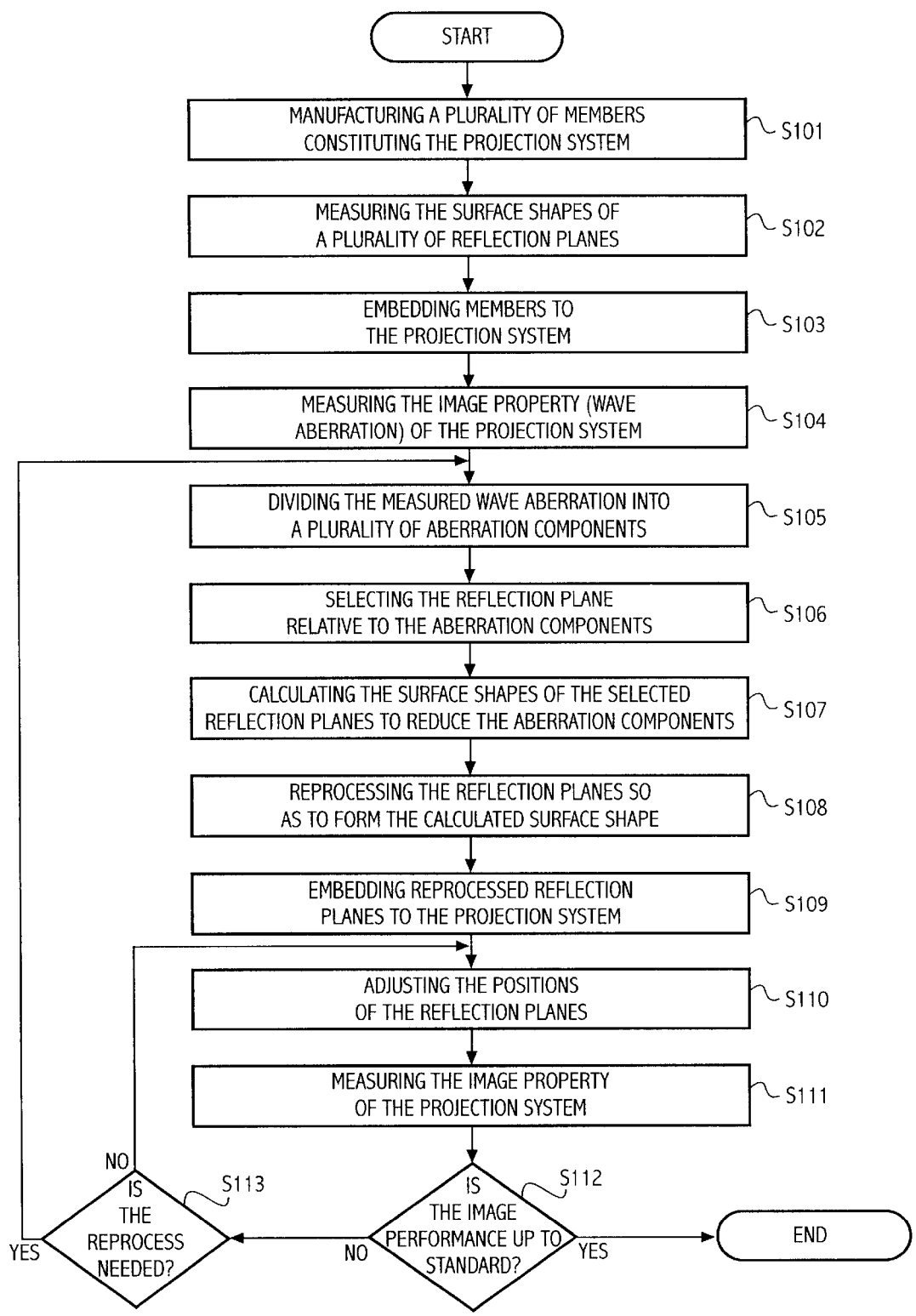
FIG. 2 is a flowchart showing steps for manufacturing an exposure apparatus according to the first embodiment of the present invention.
Figure 3:
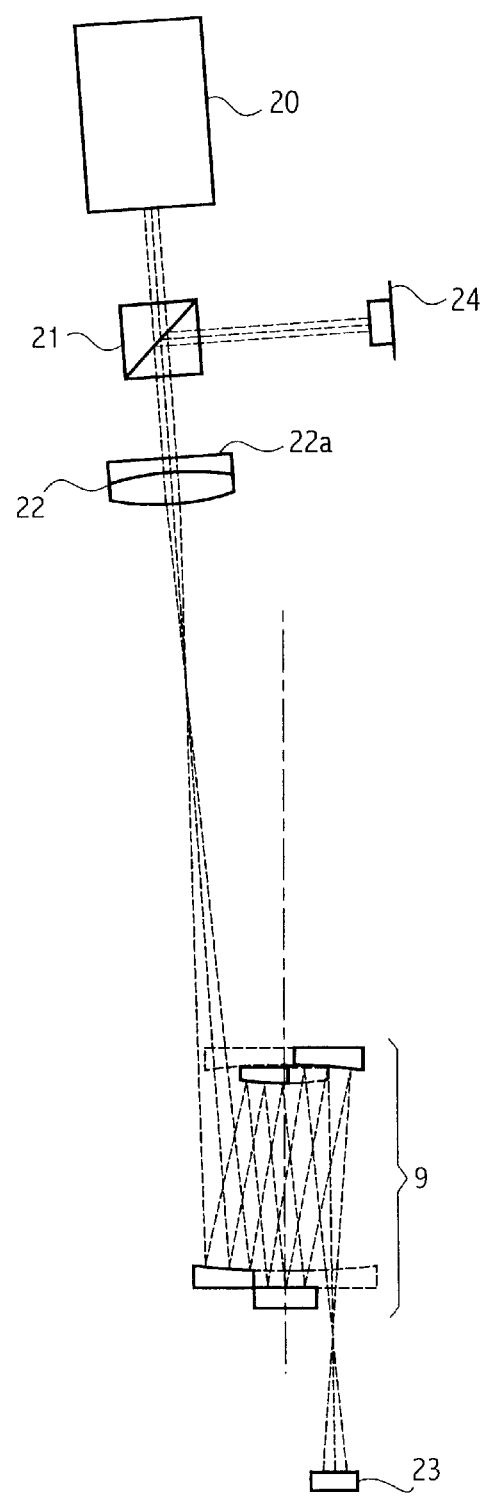
FIG. 3 shows an example of a wave aberration measuring apparatus used in a method for manufacturing an exposure apparatus according to the first embodiment of the present invention.
Figure 4:
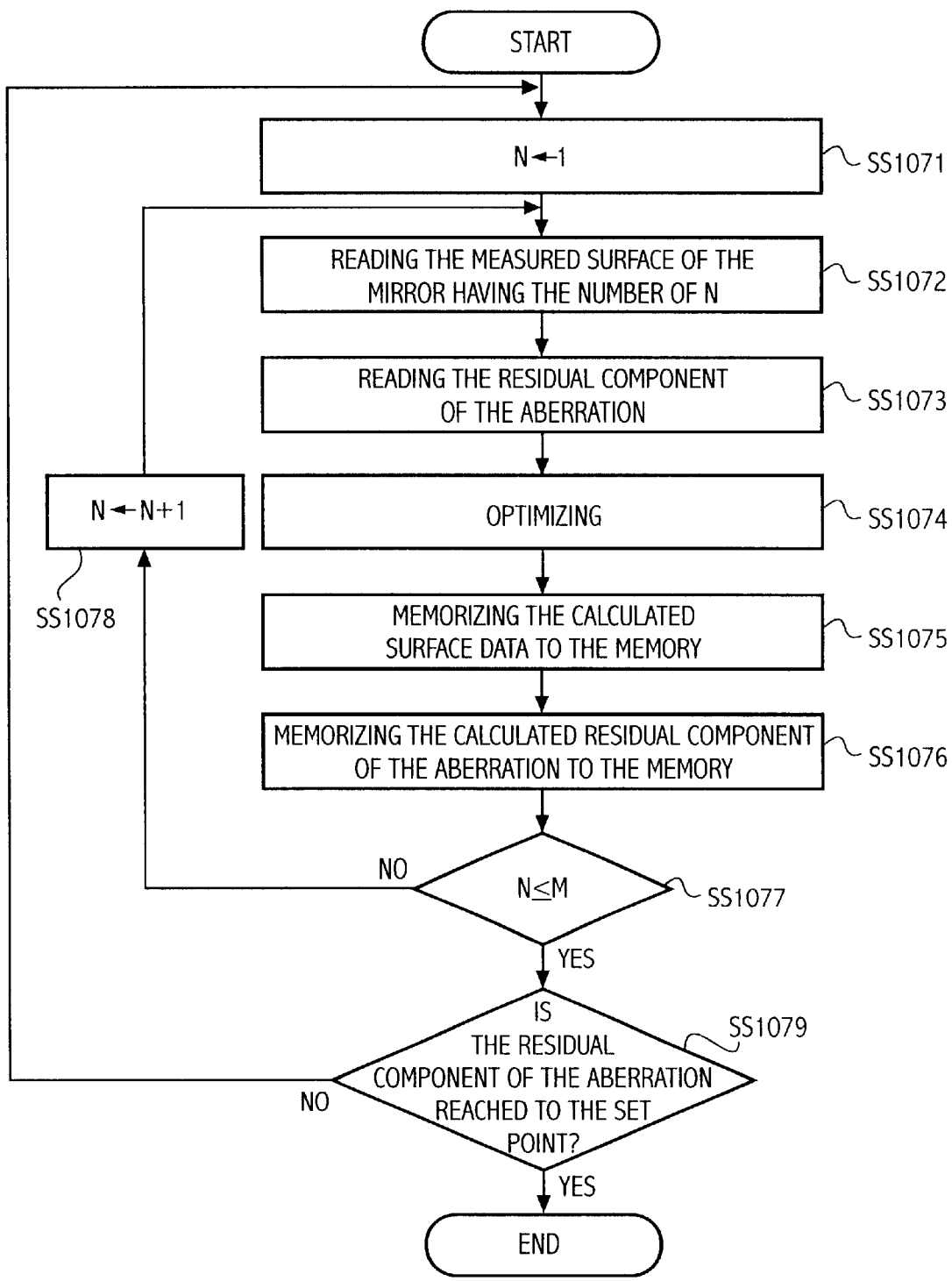
FIG. 4 is a flowchart showing steps for manufacturing an exposure apparatus according to the first embodiment of the present invention.

Described below with reference to FIG. 2—FIG. 4 is the method for manufacturing the projection system of this embodiment. FIG. 2 is a flowchart showing the steps for manufacturing the projection system of this embodiment. FIG. 3 shows the schematic frame of the interferometer for measuring the image property of the projection system. In the step S101, the mirrors constituting the projection system, the holder and the barrel holding the mirrors (which is not illustrated in FIG. 1) are manufactured according to the design factor of the predetermined data of the optical architecture. The surface of the mirrors are coated with a multi-layer membrane for reflecting the EUV radiation.

In the step S102, the surface shapes of the mirrors manufactured in the step S101 are measured by the interferometer. An interferometer using a non-exposure light such as visible light or an interferometer using an exposure light (the EUV radiation) can be used for this measuring step. When the interferometer is using a non-exposure light (for example the well-known Fizeau interferometer and Twyman-Green interferometer) to measure the surface shape of the mirrors, the measurement result may be different from the measurement result obtained by using the EUV radiation. This is because the non-exposure light is reflected by the surface of the multi-layer membrane while the EUV radiation exposure light can be reflected by the interior of the multi-layer membrane. This deviation is added to the measured data as the offset in this case. The interferometer disclosed in the U.S. Pat. No. 5,076,695 by the present applicant can be used for the above mentioned measuring step using the exposure light as the measuring light. The above mentioned measurement of the surface shape of the mirrors using the interferometer is performed on each mirror (91–94) of the projection system 9. The measured data of the surface shape is memorized in the memory member connected to the operation member in much the same way as a calculator through an input system such as a console.

In step S102, each mirror 91–94 held by a holder is built into the barrel of the projection system 9. In this embodiment, the holder comprises an apparatus for adjusting the spatial position of each mirror (91–94) and a position measuring apparatus such as a micrometer for measuring the position of each mirror based on the predetermined reference position. In the step S103, the information of the position of the reflection plane in connection with the position of each mirror 91–94 is memorized in the above mentioned memory member in parallel with the step for composing the projection system 9.

In step S104, as shown in FIG. 3, the imaging performance (wave aberration) of the projection system 9 composed in the step S103 is measured. The measurement is performed by attaching the projection system 9 to the wave aberration measuring apparatus shown in FIG. 3. The wave aberration measuring apparatus shown in FIG. 3 can be attached to the body of the exposure apparatus. In FIG. 3, the laser light source 20 illuminates the laser light having a predetermined wave length range as nearly plane waves. This laser light is directed to the condensing optical system 22 after going through the beam splitter 21. The condensing optical system 22 has negligible aberration because the spherical aberration and the offense against the sine condition is lowered to be negligible compared with the measurement error of the wave aberration measuring apparatus. The incidence plane 22a of the condensing optical system 22 has the same shape as the incident plane wave (that is the plane shape). The plane wave entering the incidence plane 22a is subject to amplitude splitting because the incidence plane 22a is a half-mirror. The reflected light goes back to the beam splitter 21 with the plane wave remaining as the reference light. The light transmitted by the incidence plane 22a is condensed by the condensing optical system 22, converted to a spherical wave, and goes to the projection system 9. It is correct that the final plane of the condensing optical system 22 can be used as the reference plane.

The position of the projection system 9 is such that the position of the mask plane of the projection system 9 is coincides to the position of the focal point of the spherical wave in the wave aberration measuring apparatus. The spherical wave emanated from the mask plane enters the projection system 9. If the wave aberration does not exist in the projection system 9, that is, if the projection system 9 is an ideal optical system, a spherical wave is emanated from the projection system 9 and condensed at the position of the image plane. The spherical mirror 23 is deposited on the emanating side of the projection system 9. The surface shape of the spherical mirror 23 is equal to the spherical wave emitted by the projection system 9 when the projection system 9 is an ideal optical system. Therefore, if the projection system 9 is an ideal optical system, the spherical wave having the same shape as the spherical wave emitted by the projection system 9 returns again to the projection system 9. If the projection system 9 has a wave aberration, a wave having the shape according to the wave aberration returns to the projection system 9. The measuring light reflected by the spherical mirror 23 and returned to the projection system 9 emanates from the projection system 9 and goes to the beam splitter 32 through the condensing optical system 22. The reference light reflected by the incidence plane of the condensing optical system 9 also goes to the beam splitter 21 as described above. The measuring light and the reference light are reflected by the beam splitter 21 and directed to the light receiving plane made of a light receiving material 24. It consists of a photoelectric conversion element such as CCD. If the projection system 9 has a wave aberration, the interference fringes are measured on the light receiving plane in accordance with the wave aberration. The shapes of these interference fringes relate to the difference between the reference wave plane and the wave plane of the luminous flux shuttled to and from the projection system 9. The wave aberration of the projection system 9 is therefore calculated by image analysis of these interference fringes. The wave aberrations at a plurality of the positions in the field of the projection system 9 (or the exposure area) can be measured by moving the projection system 9, the condensing optical system 21 and the spherical mirror 23 relative to each other.

The laser light source 20 is not limited to just a laser. A light source emitting a plane wave having much longer coherent length can be used as the laser light source 20.

In the above mentioned example, the measurement is performed using a light having a different wave length from the exposure light of the projection system 9. This is because the projection system 9 is a reflection type optical system consisting of only mirrors, and the chromatic aberration can be neglected. In this case, a difference between the measured wave aberration and the wave aberration under the EUV radiation may arise because the measuring light is reflected by the surface of the multi-layer membrane on each mirror 91–94 in the projection system 9 while the EUV radiation as the exposure light may be reflected by the interior of the multi-layer membrane. This deviation between the measured wave aberration and the wave aberration under the exposure light is added to the measured wave aberration as the offset.

The measurement can be performed by using exposure light instead of non-exposure light. In the case of using exposure light, the principle of the interferometer disclosed by the present applicant in the Japanese Laid-Open Publication 57-64139 and U.S. Pat. No. 5,076,695 can be used. When using the interferometer disclosed in the Japanese Laid-Open Publication 57-64139, a reflection optical element is used instead of the refraction optical element, and the element for converting the EUV radiation to the detective light such as UV-visible-IR light (such as the fluorescence board) is deposited at the position of the detector. For example, the method for detecting the photo current of the metal blocks arranged in the matrix form can be used, and an element sensitive to the EUV radiation can be used as the detector.

In step S105, the wave aberration $W(\rho, \theta)$ expanded by the orthogonal functions such as Zernike's cylindrical functions is calculated from the wave aberration obtained in above mentioned step S104. In the following equation r denotes the normalized pupil radius and q denotes the radius vector angle at the pupil (positive for anti clockwise direction).

The wave aberration $W(\rho, \theta)$ is represented by the formula below.

$W(\rho, \theta) = Z0$
$\quad + Z1\rho\cos\theta$
$\quad + Z2\rho\sin\theta$
$\quad + Z3(2\rho^2 - 1)$
$\quad + Z4(\rho^2\cos2\theta)$
$\quad + Z5(\rho^2\sin2\theta)$:

wherein Z0, Z1, Z2, Z3, Z4, Z5 . . . are the coefficients of each term.

Each term of the above mentioned formula of the wave aberration represents an aberration such as distortion, focus, third order astigmatism, third order coma, third order spherical aberration, coma having three times rotation symmetry, fifth order astigmatism, fifth order coma, fifth order spherical aberration, and similar. Thus, the wave aberration is derived into a plurality of aberration components.

In step S106, each aberration component requiring correction is linked to the reflection plane constituting the projection system 9. Then, the reflection plane to be reprocessed is selected. Prior to step S106, the amount of change is calculated for every aberration component by simulation. This is necessary when the design factor according to the optical design data of the projection system 9 (the shape and the position of each reflection plane) requires microscopic changes. The information about the calculated amount of change is memorized in the memory member connected to the operation member in much the same way as a calculator through an input system such as a console.

The residual component of aberration is calculated by subtracting the aberration component which can be corrected by changing the position of the reflection plane (the direction of the optical axis, the direction perpendicular to the optical axis, the direction of rotation about the axis perpendicular to the optical axis, the direction of rotation about the optical axis) from a plurality of aberration components which should be corrected. This residual component of the aberration is the aberration component which can only be corrected by changing the shape of plurality of reflection planes. The details of the residual component of aberration are also memorized in the memory member connected to the operation member in much the same way as a calculator through an input system such as a console.

When the system is non-telecentric on the side of the object plane, the magnification error can be corrected by changing the distance from the object plane to the projection system along the optical axis. The residual component of the aberration is therefore calculated by subtracting the magnification error.

Next, the reflection plane which requires a change in its shape to effectively correct the residual component of aberration is selected on the basis of the degree of the change of the aberration component on each reflection plane which is calculated by simulation, and the residual component of aberration. The information about the relationship between the residual component of aberration and the reflection plane is also memorized in the memory member connected to the operation member in much the same way as a calculator through an input system such as a console.

It is preferable that the aberration component relative to the displacement of the image is corrected by the reflection plane near the object plane or the image plane. The aberration component relative to the displacement of the image can be corrected by the reflection plane near the image plane with little influence compared to the aberration component relative to the displacement of the image plane caused by a numerical aperture. There is advantage therefore that the calculation in S106 and S107 is very simple. It is preferable that the projection system 9 is deposited near the object plane when the projection system 9 has reduced magnification. This is because the width of the luminous flux is narrower on the side of the mask plane compared to the side of the image plane and the aberration given to images adjoining each other is easy to control independently.

For the above mentioned reason in the embodiment shown in FIG. 1 the mirror 91 placed near the object (reflection type reticle 8) plane is selected as the reprocessing (changing) reflection plane. This allow to make the correction of image displacement aberration component independently of the other aberration components. The mirror placed near the object plane (image plane) refers to the mirror placed at the position where the fluctuation of the aberration component except the aberration component relative to the displacement of the image from the ideal image on the image plane (such as isotropic or anisotropic magnification error, isotropic or anisotropic distortion) is less than half of the fluctuation of the aberration component relative to the displacement of the image from the ideal image on the image plane when the shape of the mirror is modulated by reprocessing or changing the mirror.

For the above mentioned reason, in the embodiment shown in FIG. 1 the mirror 93 placed near the position of the aperture stop is selected as the reprocessing (changing) reflection plane so as to correct mainly the aberration component relative to the displacement of the image caused by the numerical aperture. The mirror placed near the position of the aperture stop refers to the mirror placed at the position where the fluctuation of the aberration component except the aberration component relative to the displacement of the image caused by the numerical aperture (the aberration component dependent on the pupil coordinate of the luminous flux passing through the pupil such as spherical aberration, coma, astigmatism) is less than half of the fluctuation of the aberration component relative to the displacement of the image caused by the numerical aperture when the shape of the mirror is modulated by reprocessing, or changing the mirror.

When selecting a reflection plane near the mask plane or the image plane and/or a reflection plane near the aperture stop as the reflection plane to change the shape, the reflection plane can be selected on the basis of calculated residual component and the amount of the change of the reflection plane mentioned above.

In the step S107, the shape of each selected reflection plane is calculated so as to correct the residual aberration. This step S107 comprises a plurality of sub-steps SS1071~SS1078 described below.

In description of sub-steps below, m denotes the total number of the reflection planes selected in the step S106, and n denotes the reflection plane which shape is calculated. In the sub-step SS1071 n=1 which denotes the number of the reflection plane. In the sub-step SS1072, the shape data of each reflection plane constituting the projection system 9 measured in the step S102 and the information of the position of each reflection plane memorized in the step S103 are read from the memory. In the sub-step SS1073, the residual component of the aberration is read from the memory. In the sub-step SS1074, the shape of the reflection plane n is optimized so as to correct the aberration component considering the shape data of the reflection plane and the position information of the reflection plane read in the sub-step SS1072 as the initial data. In this optimizing step, the parameter to be changed is the shape of the reflection plane n, and the evaluation value is the adjustable aberration component. The aberration is calculated by the optical path tracking simulation using the corrected shape and the position of the reflection plane. The residual component of the aberration as the evaluation value is calculated by subtracting the aberration component which can be reduced by adjusting the position of each reflection plane from the aberration calculated by the simulation. This step is performed until the evaluation value becomes less than set point.

A local optimization method such as the DLS (Damped Least Square Method) and the global optimization method such as the GA (Generic Algorithm) can be used in the sub-step SS1704. As the shape of the reflection plane is the parameter used in the sub-step SS1704, not only the rotation symmetric parameters such as the radius of curvature, the aspherical coefficient, but also the gradient of the plane in a plurality of coordinates on the reflection plane can be used. In this embodiment both of these methods are used.

In the sub-step SS1075, the shape of the reflection plane calculated in the sub-step SS1074 is memorized in the memory. The shape data of the reflection plane read in the sub-step SS1072 in the next loop will be the shape data memorized in the sub-step SS1075, not the measured shape data.

In the sub-step SS1076, the residual component of the aberration calculated in the sub-step SS1074 is memorized in the memory. The residual component of the aberration used in the sub-step SS1073 in the next loop will be the data memorized in this sub-step.

In the sub-step SS1077, the decision is made whether the n which is the number of the reflection plane whose shape is calculated overreaches the m which is the total number of the selected reflection planes. If n is less than m, then sub-step SS1078 is performed so as to calculate the shape of the reflection plane having the number of n+1. Following this, the sub-step SS1072 is performed again. Alternatively, the sub-step SS1079 is performed.

In the sub-step SS1079, the decision is made whether the residual component of the aberration memorized in the memory is less than the set point. If the residual component of the aberration is less than the set point, the sub-steps SS1071–SS1079 are completed and the step S108 is performed. If not, the sub-step SS1071 is performed again so as to optimize the shape of the selected reflection plane.

The sub-step SS1079 is effective in case where the change of the shape of one of the plurality of the reflection planes physically influences the aberration component to be corrected by changing the shape of another reflection plane when a plurality of reflection planes are selected in step S106. As described in step S106, there is an advantage that the divergence of the solution is suppressed if the reflection plane can correct the predetermined aberration component among the image properties in the projection system 9 without physically influencing other aberration components.

In step S107, the shape to physically correct the residual component of aberration can be calculated by proportional calculations from the data about the value of the change calculated in step S106 instead of the above mentioned optimization method. In this case it is preferable that the change of the surface shape of the selected reflection plane does not influence the aberration component to be corrected by the change of the surface shape of another reflection plane.

In the step S108, the mirrors are outside of the projection system 9, and processed so that the surface shape of the mirror becomes the shape calculated in the step S107. In this embodiment, the surface shape of the mirror is nearly equal to the surface shape of the multi-layer membrane placed on the surface of the mirror. In the step S108, the distribution of the thickness of the membrane on the mirror is changed either by a method of removing partially the multi-layer membrane disposed on the mirror, the method for laminating partially the multi-layer membrane on the mirror, or the method combining above mentioned methods. The method for removing partially the multi-layer membrane is disclosed in the Japanese Laid-Open Publication 7-84098 by the present applicant, and the method for laminating partially the multi-layer membrane is disclosed in the Japanese Laid-Open Publication 10-30170 by the present applicant.

In step S108, the reprocessing to change the surface shape can be performed on another mirror which has the same design factor as the mirror to be taken out of the projection system for reprocessing. In this case, the real shape of the surface of the provided mirror is measured in advance.

In step S109, the mirrors processed in step S108 are incorporated into the projection system 9.

In step S110, the position of the mirror is adjusted based on the information of the position of the reflection plane memorized in the memory.

In step S111, the wave aberration of the projection system 9 is measured as in step S104.

In step S112, the decision is made whether the wave aberration measured in the step S111 is up to the standard. If the wave aberration is up to the standard, the adjustment of the projection system 9 is completed, or alternatively the next step S113 is performed.

In the step S113, the wave aberration measured in the step S112 is derived into a plurality of aberration components as the step S105. The residual component of aberration is calculated by subtracting the aberration component that can be corrected by changing the position of each reflection plane from these aberration components. The decision is then made whether the reprocessing of the reflection plane is needed by comparing the residual component of the aberration with the threshold value. If the residual component of the aberration is less than the threshold value, the next step S110 is performed because there is no need to reprocess the reflection plane. Alternatively the next step S105 is performed to reprocess the reflection plane.

The reflection type projection system having excellent image properties is manufactured by above mentioned steps S101–S113. Additionally, the exposure apparatus which can transcribe accurately microscopic patterns by embodying this projection system, the illuminating system, the alignment system, the stage, and similar components in the body of the exposure apparatus are also manufactured by the above mentioned steps S101~S113.

Figure 5:
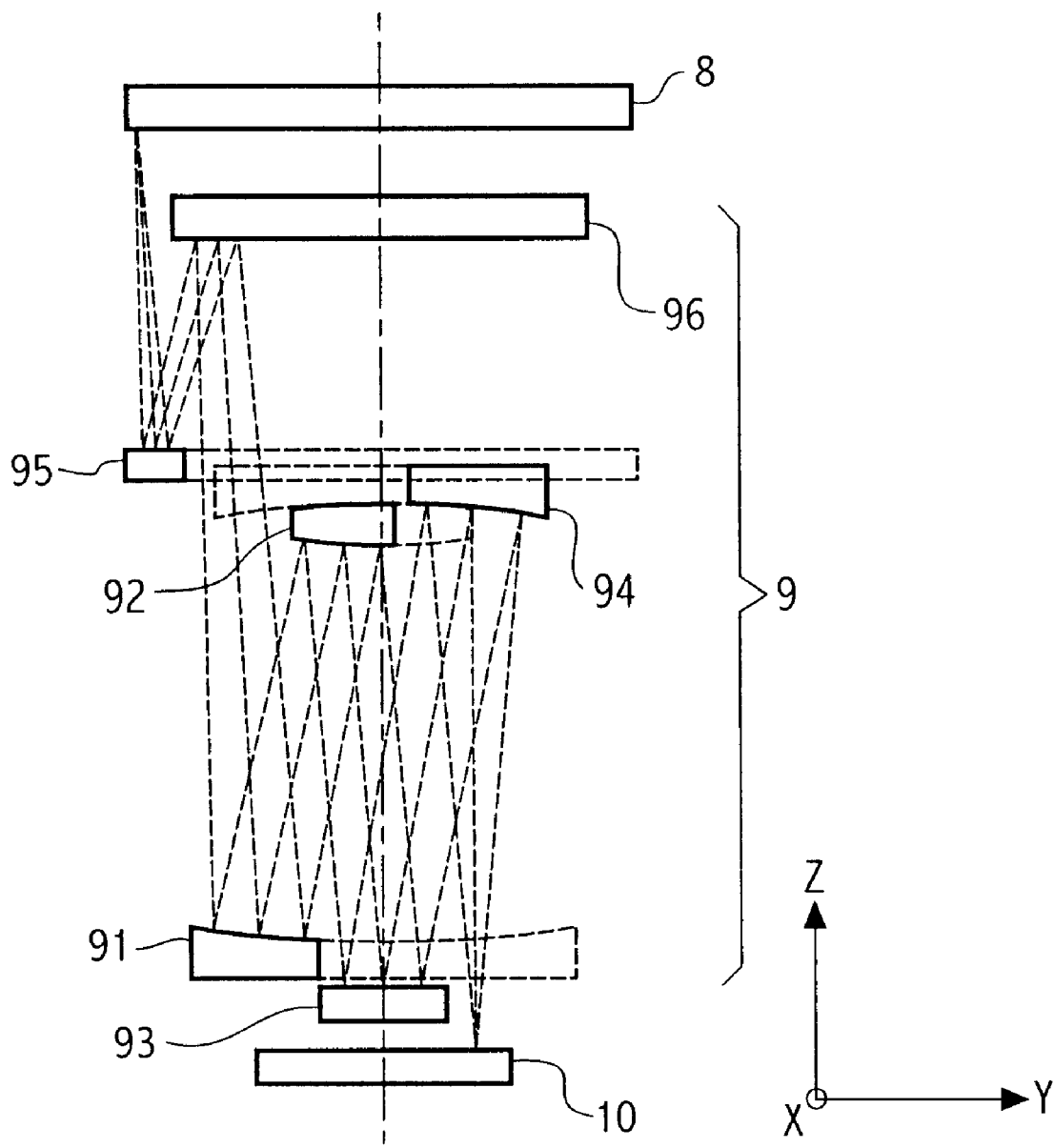
FIG. 5 shows a projection system of an exposure apparatus according to the second embodiment of the present invention.

Next, the second embodiment of the present invention will be described with reference to FIG. 5. The second embodiment includes the modified projection system 9. All the other components are similar to the components of the first embodiment. The drawings and the description of other components will therefore be omitted. In FIG. 5, the projection system 9 comprises two mirrors 95, 96 having a plane shape, a mirror 91 having a concave shape, a mirror 92 having a convex shape, a mirror 93 having a convex shape, and a mirror 94 having a concave shape. Each mirror is deposited at the position where their optical axes (normal axis of the reflection plane in the case of the plane mirror) are coaxial. Each mirror 91–96 consists of the substrate coated by the multi-layer membrane for reflecting the EUV radiation. The mirrors 91, 92, 94 and 95 have a notch so as not to block the optical path formed by each mirror 91–96. Each mirror 91–96 is deposited at the position where the EUV radiation reflected by the reflection type reticle 8 is directed to the image plane by the mirror 95, the mirror 96, the mirror 91, the mirror 92, the mirror 93, and the mirror 94 in this order. The non-illustrated aperture stop is deposited at the third mirror 93, and the telecentric system on the image plane side (wafer side) is produced by this aperture stop. Within the projection system 9 shown in FIG. 5 is also the non-telecentric system on the side of the reflection type reticle 8. This makes it easy to isolate the optical path to the reflection type reticle 8 from the optical-path from the reflection type reticle 8 to the projection system 9.

Figure 6:
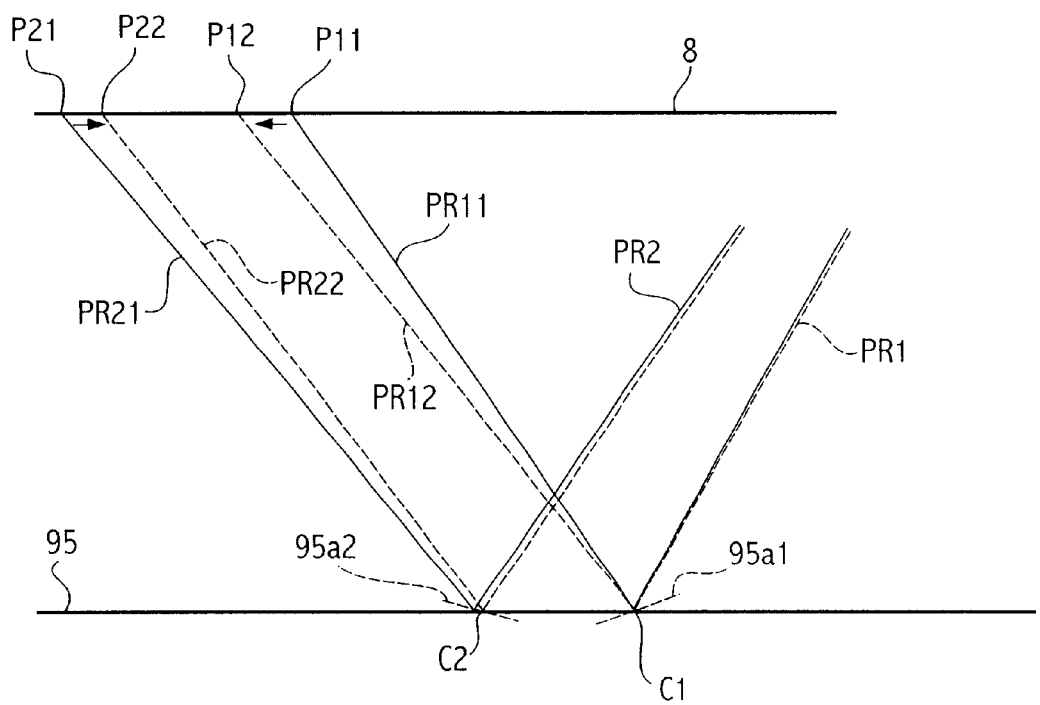
FIG. 6 is a diagram explaining a method for choosing a surface shape according to the second embodiment of the present invention.

FIG. 6 illustrates the method for determining the surface shape of the mirror 95. In FIG. 6, it is supposed that the main beam perpendicular to the image plane in the image side (the side of the wafer 10) enters the projection system 9 from the image side. The main beams PR1, PR2 pass through the mirrors 91–94 and 96 and are reflected at the control points C1 and C2 on the reflection plane of the mirror 95. When the surface shape of the projection mirror 95 is plane in the initial state, the main beams reach the points P11, P12 on the reflection type reticle 8. If the projection system 9 has no aberration relative to the displacement of the image, this main beam should reach the ideal image points P12 and P22. The reflection plane is inclined near the control points C1 and C2 so that the main beams reach the ideal image points P12 and P22. The gradients of the inclined reflection planes $95a1$ and $95a2$ are calculated on the basis of the difference between the ideal image points P12 and P22 and the measured image points P11 and P21, the distance between the reflection type reticle 8 and the mirror 95, and the telecentricity at each ideal image point P12 and P22 (the gradient between the designed main beam reaching the ideal point and the optical axis). The surface shape of the mirror 95 is calculated by binding the partial reflection plane 95a1 and 95a2 after calculating the gradient at each control point.

The above mentioned method may be interchanged with the steps S106~S108 in the first embodiment.

In the case of selecting (interchanging) the plane mirror in the projection system 9, the aberration relative to the displacement of the image can be changed with practically no influence on other aberrations.

In the projection system 9 shown in FIG. 5, if the mirror 95 and/or the mirror 96 are totally given the curvature, the Petzval's sum of the projection system 9 can be adjusted, as is effective for adjusting the curvature of the field.

If the plane mirror 95 and/or the plane mirror 96 are changed to have the toric shape or the cylindrical shape, the magnification error of the image can be adjusted along each X or Y direction independently.

If the plane mirror 95 and/or the plane mirror 96 is given the local power distribution, the gradient or the curvature of the image plane can be adjusted because the distribution of the focal point on the image plane along the optical axis can be changed to the desired value. If the surface shape of the reflection plane is given so that the local power along the sagittal direction is different from the local power along the meridian direction, the astigmatism at each point on the image plane can be adjusted.

In case the mirror 96 in addition to the mirror 95 is selected (changed), the telecentricity at each point on the image plane as well as the displacement of the image can be controlled, though only the aberration relative to the displacement of the image is adjusted in the example described above. In this case, the telecentricity is controlled so that the telecentricity is equal to the designed telecentricity. When adjusting the magnification error by changing the distance between the reflection type reticle 8 and the projection system 9 along the optical axis, the telecentricity can be controlled so that the gradient of the main beam projecting to the YZ plane is equal to the gradient of the main beam projecting to the XZ plane.

In this case, when changing the distance between the reflection type reticle 8 and the projection system 9 along the optical axis the magnification ratio along the scanning direction can be made equal to the magnification ratio along the direction perpendicular to the scanning direction.

Figure 7:
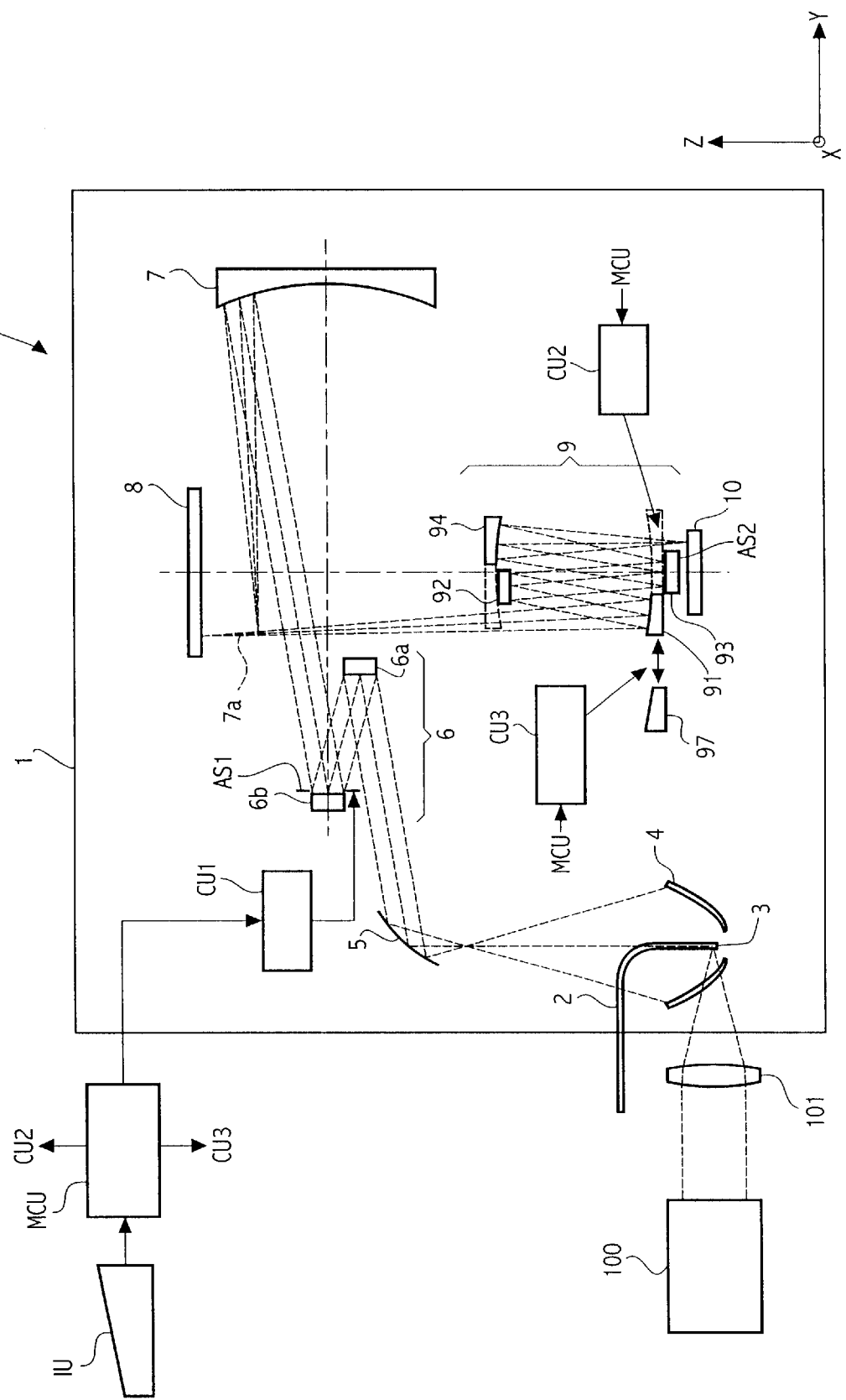
FIG. 7 schematically shows an exposure apparatus according to the third embodiment of the present invention.

In the above example, the method for manufacturing an optimized projection system under certain exposure condition is described. There can be a case, however, in which the system optimized under certain conditions is not optimized under other conditions. This occur when the illuminating condition, the type of resist, the pattern rule, the environment of the system, and the similar conditions may vary substantially. In such case, both the mirror optimized under certain condition and the mirror optimized under other conditions can be made changeable. FIG. 7 shows the exposure apparatus comprising a plurality of mirrors changeable according to the exposure condition.

The difference between the exposure apparatus shown in FIG. 7 and the exposure apparatus shown in FIG. 1 is described below. In FIG. 7, the σ lens stop AS1 for varying the shape of the optical path is deposited near the second reflection element 6b of the reflection type fly-eye optical system 6. This forms the second light source consisting of a plurality of light source images. The shape of the optical path can be selected from the circular shape having the first diameter (for large σ illumination), the circular shape having a shorter diameter than the first diameter (for small σ illumination), the zone shape (for zone illumination), and four circular or fan shapes placed at the eccentric position from the optical axis (for quadropole illumination). This σ lens stop AS1 is controlled by the σ lens stop controlling unit CU1 so that the shape of the optical path can be changed. The variable aperture stop AS2 which can change the diameter of the optical path is deposited near the mirror 93 in the projection system 9. The diameter of the optical path of the variable aperture stop AS2 is controlled by the variable aperture stop controlling unit CU2. In FIG. 7, the mirror 91 nearest the reflection type reticle 8 is interchangeable with the mirror 97 although their surface shapes are different. This interchange is controlled by the mirror interchange controlling unit CU3.

The main controlling unit MCU is connected with the σ lens stop controlling unit CU1, the variable aperture stop controlling unit CU2, the mirror interchange controlling unit CU3, and the input unit IU which inputs information about the exposure condition. An input apparatus such as a console and a bar code reader detecting the bar code on the reflection type reticle 8 or similar can be used as the input unit IU.

After receiving information about the exposure condition from the input unit, the main controlling unit MCU transmits the controlling signal about the exposure condition such as the σ value to the σ lens stop controlling unit CU1 and the variable aperture stop controlling unit CU2. The table containing the relation information between the exposure condition and the type of the mirror is memorized in the memory in the main controlling unit MCU. The main controlling unit MCU transmits the controlling signal regarding the mirror to be used to the mirror interchange controlling unit CU3.

The σ lens stop controlling unit CU1 drives the σ lens stop AS1 so that the shape of the second light source is equal to the predetermined shape. The variable aperture stop controlling unit CU2 drives the variable aperture stop AS2 so that the numerical aperture of the projection system is equal to the predetermined value. An optimized image property under any condition is achieved by above mentioned method.

In FIG. 7, the distribution of the optical property of the EUV radiation (such as the amplitude distribution, the phase distribution) can be changed at the position near the variable aperture stop AS2 according to the type of the pattern to be transcribed (such as line and space pattern, contact hole pattern). In this case, the mirrors 91 and 97 can be changed so as to adjust the aberration fluctuation by changing the distribution of the optical property of the EUV radiation. The reflectance distribution or the shape distribution of the mirror 93 can be changed so as to change the distribution of the optical property of the EUV radiation near the pupil. In this case, the mirror 93 can be also changed to a mirror having another reflectance distribution or another shape distribution.

The nonlinear stretch of wafer caused by the wafer production process and associated magnification error and distortion etc. which is asymmetric along the rotation axis caused by the difference of the exposure apparatus could be adjusted if the mirror 96 has a toric shape or a cylindrical shape and the mirror 96 is able to rotate around the optical axis.

In the first embodiment, the step S112 can be performed between the step S104 and the step S105. In this case, if the image property is up to grade in step S112, then the process is finished. If not, step S105 is performed. If the residual component of the aberration is negligible in step S106, the step S110 is performed in order to adjust the position of the reflection plane.

In the first embodiment, when selecting the reflection plane to change the shape in step S106, only one predetermined reflection plane can be selected. Following this, steps S107–S112 are performed. If the residual component of the aberration relative to the selected reflection plane is over the predetermined threshold in step S113, then the same steps as in the first embodiment are performed. If the residual component of the aberration relative to the other reflection plane is excessive, then another reflection plane is selected and step S107 is performed. If the aberration component relative to the displacement of the image is dominant in step S105, only the mirror 91 nearest to the mask in the projection system shown in FIG. 1 can be selected. If the aberration component relative to the displacement of the image caused by a numerical aperture is dominant, only the mirror 93 near the aperture stop can be selected.

Figure 8:
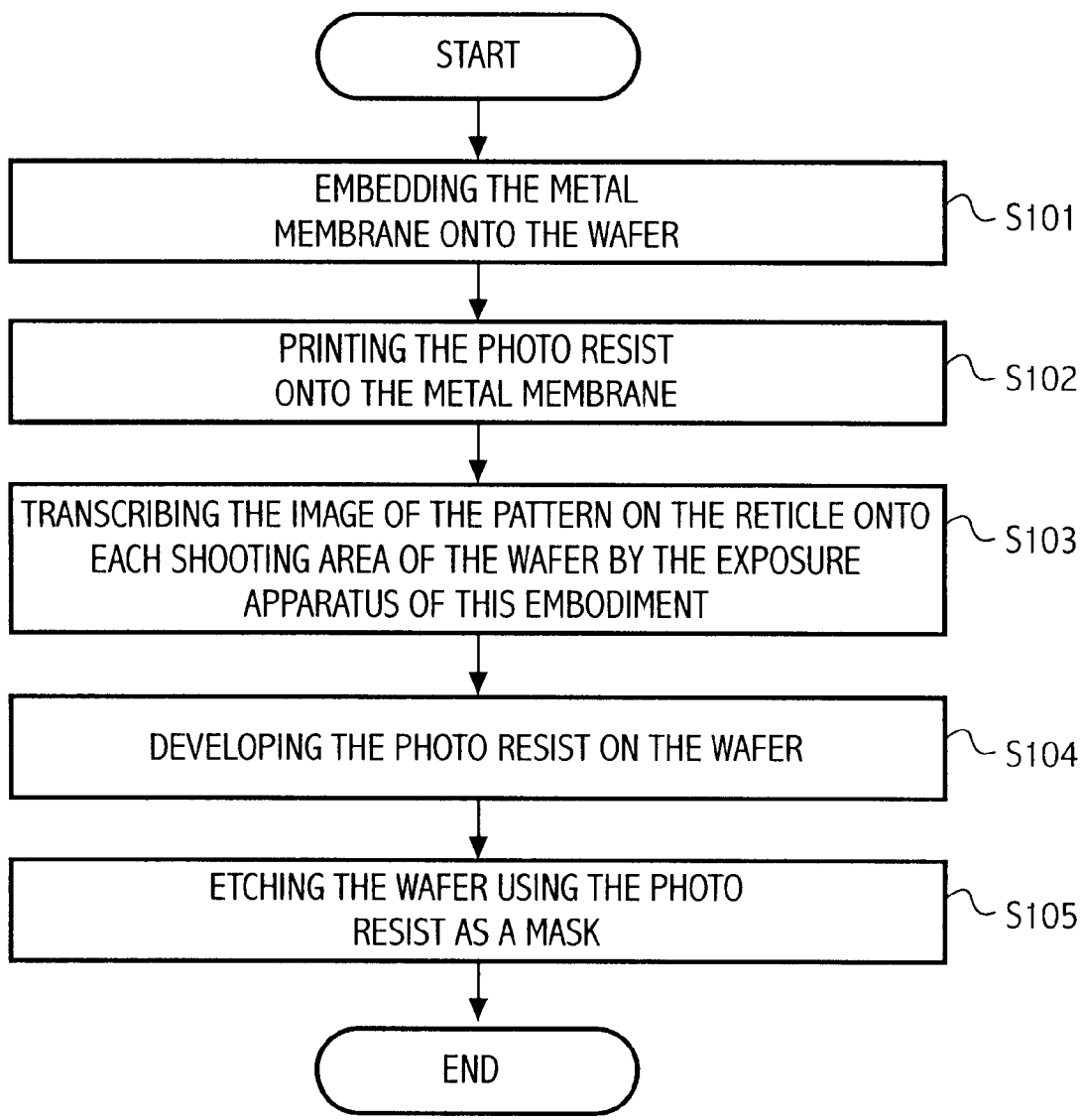
FIG. 8 is a flowchart showing steps for manufacturing a device according to the embodiment of the present invention.

The embodiment for forming a predetermined circuit pattern onto a wafer by the above mentioned exposure apparatus is described below with reference to flowchart shown in FIG. 8. Initially, in step 101 in FIG. 8, a metal membrane is evaporated onto one lot of the wafer. In the next step 102, the photo resist is painted onto the metal membrane on one lot of the wafer. In the step 103, the pattern image of the reticle R is exposed stepwise onto each shooting area of one lot of the wafer through the projection system C of the exposure apparatus shown in FIGS. 1, 5, or 7. In the step 104, the photo resist on one lot of the wafer is developed. In step 105, the circuit pattern corresponding to the pattern on the reticle R is formed on each shooting area of each wafer by etching. A device having the supersubtle circuit such as semiconductor device is manufactured by forming the circuit pattern on the upper layer after the above mentioned processes.

Although the present invention has been described by way of exemplary embodiments, it should be understood that many changes and substitutions may be made by those skilled in the art without departing from the spirit and the scope of the present invention which is defined only by the appended claims.

An exposure apparatus having good image properties can be manufactured by the method of the present invention in cases where the projection system comprises a small number of optical members. The exposure apparatus manufactured by the method of the present invention can form a supersubtle pattern on a substrate. A device having high resolution circuit pattern on a substrate can be manufactured by the method of the present invention.

What is claimed is:

1. A method for manufacturing an exposure apparatus which transcribes an image of a projection master on a substrate by a projection system having a plurality of reflection mirrors, comprising the steps of:
   a) measuring an image property of said projection system having said plurality of reflection mirrors;
   b) selecting from said image property an image property component to be adjusted;
   c) selecting at least one of said reflection mirrors which can adjust said image property component;
   d) calculating a surface shape of reflection mirror which can adjust substantially said image property component based on image property measurement results from step a);
   e) giving said reflection mirror selected in step c) the surface shape as calculated in step d);
   f) embedding said reflection mirror having said surface shape into said projection system.

2. A method for manufacturing an exposure apparatus according to claim 1, wherein said image property component includes an image magnification error, an image skew, a curvature of an image plane, a gradient of an image plane, a displacement of a focal point caused by a direction in an aperture, a displacement of a focal point caused by a numerical aperture, and a telecentric error.

3. A method for manufacturing an exposure apparatus according to claim 1, further comprising step of:
   g) selecting positions for the plurality of said reflection mirrors in said projection system, wherein the positions of said reflection mirrors are selected so that to adjust substantially said image property.

4. A method for manufacturing an exposure apparatus according to claim 3, wherein said image property is measured using a light having same wave length as in said projection system in said step a).

5. A method for manufacturing an exposure apparatus according to claim 3, wherein said image property is measured by using a light having a wave length different from that used in said projection system in step a).

6. A method for manufacturing an exposure apparatus according to claim 3, wherein a reflection mirror is given the surface shape as calculated in step d), and said reflection mirror in the projection system which is selected in step c) is interchanged with the reflection mirror having said surface shape.

7. A method for manufacturing an exposure apparatus according to claim 6, wherein said reflection mirror selected in step c) is the reflection mirror placed near said projection master or said substrate.

8. A method for manufacturing an exposure apparatus according to claim 6, wherein said reflection mirror selected in step c) is the reflection mirror placed near an aperture stop of said projection system.

9. An exposure apparatus comprising an X-ray source, an illumination system for guiding said X-ray from said X-ray source to a mask, a projection system for projecting a pattern on said mask by guiding said X-ray to an exposed plane through said mask, wherein said projection system is manufactured by the method according to claim 1.

10. An exposure apparatus comprising an X-ray source, an illumination system for guiding said X-ray from said X-ray source to a mask, a projection system for projecting a pattern on said mask by guiding said X-ray to an exposed plane through said mask, wherein said projection system is manufactured by the method according to claim 6.

11. An exposure apparatus comprising an X-ray source, an illumination system for guiding said X-ray from said X-ray source to a mask, a projection system for guiding said X-ray to an exposed plane through said mask and projecting a pattern on said mask, wherein said projection system comprises a plurality of reflection mirrors, and at least one reflection mirror of the plurality of reflection mirrors is interchangeable with a reflection mirror having a surface shape different from said one reflection mirror.

12. An exposure apparatus according to claim 11, wherein certain aberration components among a plurality of aberration components in said projection system may be changed by interchanging said one reflection mirror with the reflection mirror having different surface shape without substantially influencing other aberration components.

13. An exposure apparatus according to claim 12, wherein said one reflection mirror is a reflection mirror placed near said projection master or said substrate.

14. An exposure apparatus according to claim 13, wherein said one reflection mirror has insignificant power.

15. An exposure apparatus according to claim 13, wherein said one reflection mirror is a reflection mirror placed near said aperture stop of said projection system.

16. An exposure apparatus according to claim 15, wherein said one reflection mirror has insignificant power.

17. An exposure apparatus according to claim 15, wherein said aperture stop is placed on at least one reflection mirror of the plurality of said reflection mirrors constituting said projection system.

18. A method for manufacturing a device using the exposure apparatus according to claim 12, comprising:

depositing a photosensitive material on said substrate;

projecting an image of the pattern on said mask onto said substrate through said projection system;

developing said photosensitive material on said substrate;

transforming a predetermined circuit pattern onto said substrate by using said developed photosensitive material as a mask.

19. A method for manufacturing a device using the exposure apparatus according to claim 13, comprising:

depositing a photosensitive material on the substrate;

projecting an image of the pattern on said mask onto said substrate through said projection system;

developing said photosensitive material on said substrate;

forming a predetermined circuit pattern onto said substrate by using said developed photosensitive material as a mask.

20. A method for manufacturing a device using the exposure apparatus according to claim 15, comprising:

depositing a photosensitive material on the substrate;

projecting an image of the pattern on said mask onto said substrate through said projection system;

developing said photosensitive material on said substrate;

forming a predetermined circuit pattern onto said substrate by using said developed photosensitive material as a mask.

* * * * *